(12) United States Patent
Lee

(10) Patent No.: US 8,854,093 B2
(45) Date of Patent: Oct. 7, 2014

(54) MULTI-PHASE CLOCK GENERATION CIRCUIT

(71) Applicant: SK hynix Inc., Icheon-si (KR)

(72) Inventor: Sang Kwon Lee, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/845,181

(22) Filed: Mar. 18, 2013

(65) Prior Publication Data

US 2014/0145764 A1      May 29, 2014

(30) Foreign Application Priority Data

Nov. 29, 2012   (KR) .......................... 10-2012-0137370

(51) Int. Cl.
*H03L 7/00*      (2006.01)
*H03K 5/15*      (2006.01)

(52) U.S. Cl.
CPC .................................. *H03K 5/15066* (2013.01)
USPC ........... 327/142; 327/108; 327/109; 327/143; 327/231

(58) Field of Classification Search
CPC .. G11C 7/222; G11C 11/4076; H03L 7/0814; H03K 5/13
USPC .......................... 327/108, 109, 142, 143, 231
See application file for complete search history.

(56) References Cited

U.S. PATENT DOCUMENTS

| | | | |
|---|---|---|---|
| 6,707,326 B1 * | 3/2004 | Magoon et al. | 327/115 |
| 7,791,390 B2 * | 9/2010 | Kuroki | 327/231 |
| 2011/0025381 A1 | 2/2011 | Yamahira | |

FOREIGN PATENT DOCUMENTS

KR      1020100003073 A      1/2010

* cited by examiner

*Primary Examiner* — John Poos
(74) *Attorney, Agent, or Firm* — William Park & Associates Patent Ltd.

(57) ABSTRACT

A multi-phase clock generation circuit includes a first clock buffer unit configured to invert and buffer a first internal clock and a second internal clock in response to an external clock, and to generate a third internal clock and a fourth internal clock, and a second clock buffer unit configured to invert and buffer the third internal clock and the fourth internal clock in response to the external clock, and to generate the first internal clock and the second internal clock.

25 Claims, 5 Drawing Sheets

MULTI-PHASE CLOCK GENERATION CIRCUIT

CROSS-REFERENCES TO RELATED APPLICATIONS

The present application claims priority under 35 U.S.C 119(a) to Korean Application No. 10-2012-0137370, filed on Nov. 29, 2012, in the Korean intellectual property Office, which is incorporated herein by reference in its entirety.

BACKGROUND

Embodiments of the present invention relate to a multi-phase clock generation circuit that generates a plurality of internal clocks having a plurality of phases.

Recently, in order to achieve high speed operation of a semiconductor memory device, a plurality of internal clocks having a plurality of phases that inputs/outputs data is utilized. For example, a method has been proposed in which four internal clocks having a phase difference of 90° therebetween are generated and used for data input/output to achieve high speed operation, compared with when data is inputted/outputted according to one external clock.

The multi-phase internal clocks may be generated using a plurality of D flip-flops. In order to generate two internal clocks having phases of 0° and 90°, respectively, two D flip-flops and inverters are required, and in order to generate two internal clocks having phases of 180° and 270°, respectively, two D flip-flops and inverters are separately required. However, for the internal clocks generated using the D flip-flops, a margin required for the high speed operation of the semiconductor memory device may not be sufficiently ensured due to an internal time delay that propagates through the D flip-flops and the inverters. Thus, since data may not be inputted/outputted at proper times, a normal operation of the semiconductor memory device may not occur.

SUMMARY

An embodiment of the present invention relates to a multi-phase clock generation circuit that generates internal clocks having a plurality of phases for a high speed operation.

In an embodiment of the present invention, a multi-phase clock generation circuit includes: a first clock buffer unit configured to invert and buffer a first internal clock and a second internal clock in response to an external clock, and to generate a third internal clock and a fourth internal clock; and a second clock buffer unit configured to invert and buffer the third internal clock and the fourth internal clock in response to the external clock, and to generate the first internal clock and the second internal clock.

In another embodiment, a multi-phase clock generation circuit includes: a first buffer configured to invert and buffer a first internal clock in synchronization with a first edge of an external clock, and to generate a second internal clock; a second buffer configured to invert and buffer the second internal clock in synchronization with the first edge of the external clock, and to generate a third internal clock; a third buffer configured to invert and buffer the third internal clock in synchronization with a second edge of the external clock, and to generate a fourth internal clock; and a fourth buffer configured to invert and buffer the fourth internal clock in synchronization with the second edge of the external clock, and to generate the first internal clock.

According to the present invention, the plurality of internal clocks having a plurality of phases may have substantially equal periods with each other in synchronization with an edge of an external clock, thereby ensuring a sufficient margin required for the high speed operation of the semiconductor memory device.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION

Hereinafter, embodiments of the present invention will be described with reference to accompanying drawings. However, the embodiments are for illustrative purposes only and are not intended to limit the scope of the invention.

Figure 1:
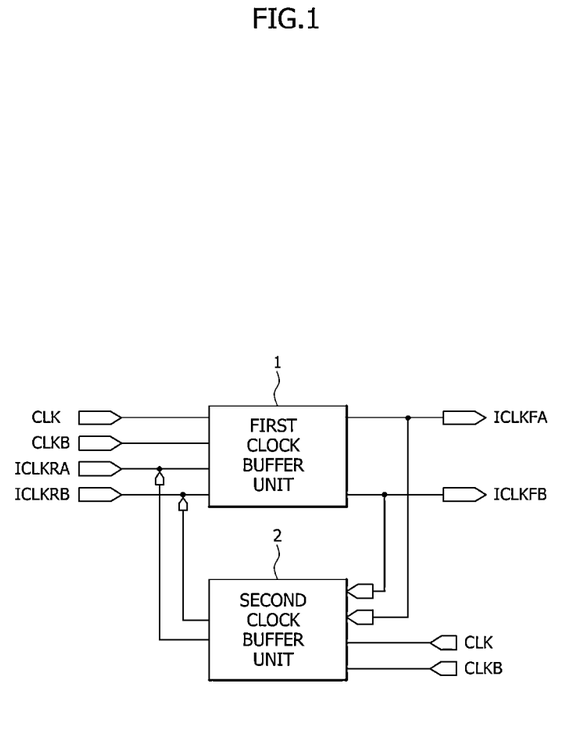
FIG. 1 is a block diagram illustrating the configuration of a multi-phase clock generation circuit according to an embodiment of the present invention.

As illustrated in FIG. 1, the multi-phase clock generation circuit according to an embodiment of the present invention may include a first clock buffer unit 1 and a second clock buffer unit 2. The first clock buffer unit 1 may be configured to buffer a first internal clock ICLKRA and a second internal clock ICLKRB in response to an external clock CLK and an inverted external clock CLKB, and to generate a third internal clock ICLKFA and a fourth internal clock ICLKFB. The second clock buffer unit 2 may be configured to buffer the third internal clock ICLKFA and the fourth internal clock ICLKFB in response to the external clock CLK and the inverted external clock CLKB, and to generate the first internal clock ICLKRA and the second internal clock ICLKRB.

The first clock buffer unit 1 may be configured to invert and buffer the first internal clock ICLKRA in synchronization with a falling edge (corresponds to a rising edge of the inverted external clock CLKB) of the external clock CLK, and to generate the fourth internal clock ICLKFB. Furthermore, the first clock buffer unit 1 may be configured to invert and buffer the second internal clock ICLKRB in synchronization with the falling edge (corresponds to the rising edge of the inverted external clock CLKB) of the external clock CLK, and to generate the third internal clock ICLKFA.

The second clock buffer unit 2 may be configured to invert and buffer the third internal clock ICLKFA in synchronization with a rising edge (corresponds to a falling edge of the inverted external clock CLKB) of the external clock CLK, and to generate the first internal clock ICLKRA. Furthermore, the second clock buffer unit 2 may be configured to invert and buffer the fourth internal clock ICLKFB in synchronization with the rising edge (corresponds to the falling edge of the inverted external clock CLKB) of the external clock CLK, and to generate the second internal clock ICLKRB.

Since the external clock CLK and the inverted external clock CLKB are clocks that may be externally applied, the external clock CLK and the inverted external clock CLKB may be applied from an external semiconductor memory device such as a memory controller. The first internal clock ICLKRA, the second internal clock ICLKRB, the third internal clock ICLKFA, and the fourth internal clock ICLKFB, which are generated in the multi-phase clock generation circuit according to an embodiment of the present invention, may be generated to have a phase difference of 90° therebetween. For example, the third internal clock ICLKFA may have a phase delayed by 90°, the second internal clock ICLKRB may have a phase delayed by 180°, and the fourth internal clock ICLKFB may have a phase delayed by 270°, all relative to the first internal clock ICLKRA.

Figure 2:
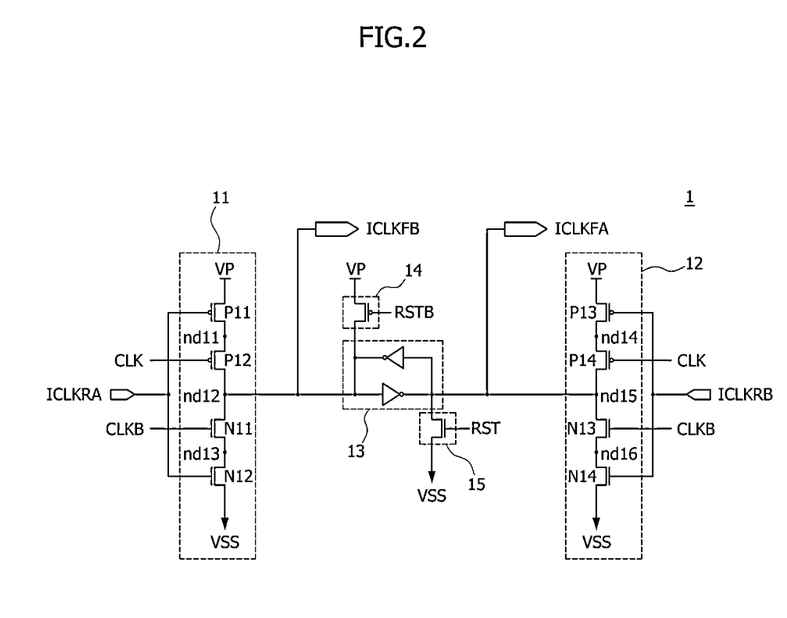
FIG. 2 is a circuit diagram of a first clock buffer unit included in the multi-phase clock generation circuit illustrated in FIG. 1 according to an embodiment of the present invention.

As illustrated in FIG. 2, the first clock buffer unit 1 may include a first buffer section 11, a second buffer section 12, a first latch section 13, a first initialization element 14, and a second initialization element 15.

The first buffer section 11 may include a PMOS transistor P11, a PMOS transistor P12, an NMOS transistor N11, and an NMOS transistor N12. The PMOS transistor P11 may be configured to be connected between a driving voltage VP and a node nd11 and turned on in response to the first internal clock ICLKRA. The PMOS transistor P12 may be configured to be connected between the node nd11 and a node nd12 and turned on in response to the external clock CLK. The NMOS transistor N11 may be configured to be connected between the node nd12 and a node nd13 and turned on in response to the inverted external clock CLKB. The NMOS transistor N12 may be configured to be connected between the node nd13 and a ground voltage VSS and turned on in response to the first internal clock ICLKRA. The first buffer section 11 may be configured to invert and buffer the first internal clock ICLKRA in synchronization with the falling edge (corresponds to the rising edge of the inverted external clock CLKB) of the external clock CLK, and generate the fourth internal clock ICLKFB. The driving voltage VP may be an internal voltage generated in the semiconductor memory device or an external voltage applied externally.

The second buffer section 12 may include a PMOS transistor P13, a PMOS transistor P14, an NMOS transistor N13, and an NMOS transistor N14. The PMOS transistor P13 may be configured to be connected between the driving voltage VP and a node nd14 and turned on in response to the second internal clock ICLKRB. The PMOS transistor P14 may be configured to be connected between the node nd14 and a node nd15 and turned on in response to the external clock CLK. The NMOS transistor N13 may be configured to be connected between the node nd15 and a node nd16 and turned on in response to the inverted external clock CLKB. The NMOS transistor N14 may be configured to be connected between the node nd16 and the ground voltage VSS and turned on in response to the second internal clock ICLKRB. The second buffer section 12 may be configured to invert and buffer the second internal clock ICLKRB in synchronization with the falling edge (corresponds to the rising edge of the inverted external clock CLKB) of the external clock CLK, and generate the third internal clock ICLKFA.

The first latch section 13 may be configured to be connected between the node nd12 and the node nd15 and to latch voltages of the node nd12 and the node nd15. The first initialization element 14 may be configured to drive the node nd12 with the driving voltage VP in response to an inverted reset signal RSTB. The second initialization element 15 may be configured to drive the node nd15 with the ground voltage VSS in response to a reset signal RST. The reset signal RST may be applied at a logic high level in an initialization operation of the semiconductor memory device, and the inverted reset signal RSTB may be applied at a corresponding logic low level in the initialization operation of the semiconductor memory device.

Figure 3:
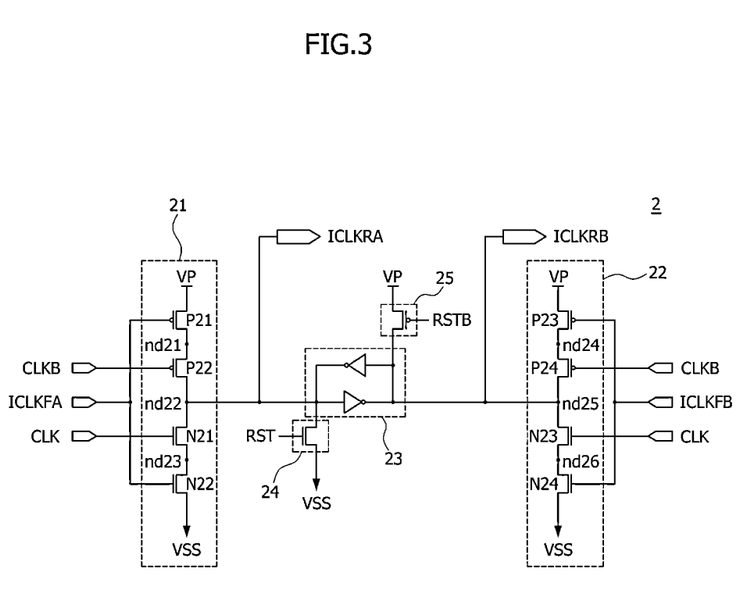
FIG. 3 is a circuit diagram of a second clock buffer unit included in the multi-phase clock generation circuit illustrated in FIG. 1 according to an embodiment of the present invention.

As illustrated in FIG. 3, the second clock buffer unit 2 may include a third buffer section 21, a fourth buffer section 22, a second latch section 23, a third initialization element 24, and a fourth initialization element 25.

The third buffer section 21 may include a PMOS transistor P21, a PMOS transistor P22, an NMOS transistor N21, and an NMOS transistor N22. The PMOS transistor P21 may be configured to be connected between the driving voltage VP and a node nd21 and turned on in response to the third internal clock ICLKFA. The PMOS transistor P22 may be configured to be connected between the node nd21 and a node nd22 and turned on in response to the inverted external clock CLKB. The NMOS transistor N21 may be configured to be connected between the node nd22 and a node nd23 and turned on in response to the external clock CLK. The NMOS transistor N22 may be configured to be connected between the node nd23 and the ground voltage VSS and turned on in response to the third internal clock ICLKFA. The third buffer section 21 may be configured to invert and buffer the third internal clock ICLKFA in synchronization with the rising edge (corresponds to the falling edge of the inverted external clock CLKB) of the external clock CLK, and generate the first internal clock ICLKRA.

The fourth buffer section 22 may include a PMOS transistor P23, a PMOS transistor P24, an NMOS transistor N23, and an NMOS transistor N24. The PMOS transistor P23 may be configured to be connected between the driving voltage VP and a node nd24 and turned on in response to the fourth internal clock ICLKFB. The PMOS transistor P24 may be configured to be connected between the node nd24 and a node nd25 and turned on in response to the inverted external clock CLKB. The NMOS transistor N23 may be configured to be connected between the node nd25 and a node nd26 and turned on in response to the external clock CLK. The NMOS transistor N24 may be configured to be connected between the node nd26 and the ground voltage VSS and turned on in response to the fourth internal clock ICLKFB. The fourth buffer section 22 may be configured to invert and buffer the fourth internal clock ICLKFB in synchronization with the rising edge (corresponds to the falling edge of the inverted external clock CLKB) of the external clock CLK, and generate the second internal clock ICLKRB.

The second latch section 23 may be configured to be connected between the node nd22 and the node nd25 and to latch voltages of the node nd22 and the node nd25. The third initialization element 24 may be configured to drive the node nd22 with the ground voltage VSS in response to the reset signal RST. The fourth initialization element 25 may be configured to drive the node nd25 with the driving voltage VP in response to the inverted reset signal RSTB.

Figure 4:
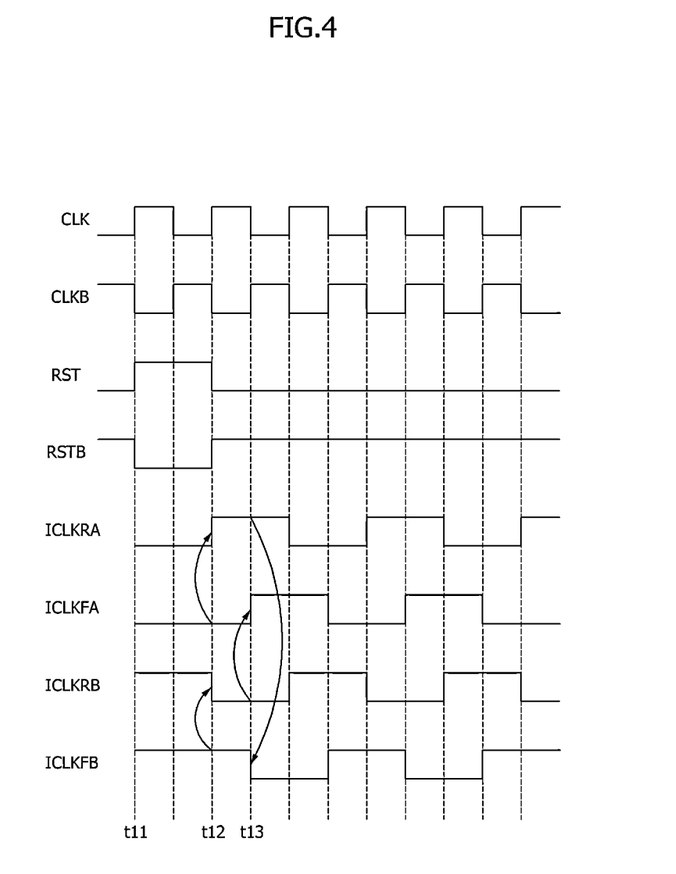
FIG. 4 is a timing diagram for explaining an operation of the multi-phase clock generation circuit illustrated in FIG. 1 to FIG. 3.

Hereinafter, the operation of the multi-phase clock generation circuit having the configurations illustrated in FIG. 1 to FIG. 3 will be described with reference to FIG. 4.

For the initialization operation, when the reset signal RST is applied at a logic high level and the inverted reset signal RSTB is applied at a logic low level between times t11 and t12, the first internal clock ICLKRA and the third internal clock ICLKFA may be initialized to a logic low level and the second internal clock ICLKRB and the fourth internal clock ICLKFB may be initialized to a logic high level.

At time t12, in synchronization with the rising edge (corresponds to the falling edge of the inverted external clock CLKB) of the external clock CLK, the third internal clock ICLKFA may be the first internal clock ICLKRA that is inverted, buffered, and transferred, and the fourth internal clock ICLKFB may be the second internal clock ICLKRB that is inverted, buffered, and transferred. The first internal clock ICLKRA may proceed to toggle from a logic low level to a logic high level and the second internal clock ICLKRB may proceed to toggle from a logic high level to a logic low level.

At time t13, in synchronization with the falling edge (corresponds to the rising edge of the inverted external clock CLKB) of the external clock CLK, the first internal clock ICLKRA may be the fourth internal clock ICLKFB that is inverted, buffered, and transferred, and the second internal clock ICLKRB may be the third internal clock ICLKFA that is inverted, buffered, and transferred. The fourth internal clock ICLKFB may proceed to toggle from a logic high level to a logic low level and the third internal clock ICLKFA may proceed to toggle from a logic low level to a logic high level.

As described above, at the rising edge (corresponds to the falling edge of the inverted external clock CLKB) of the external clock CLK, the levels of the first internal clock ICLKRA and the second internal clock ICLKRB may simultaneously toggle, and at the falling edge (corresponds to the rising edge of the inverted external clock CLKB) of the external clock CLK, the levels of the fourth internal clock ICLKFB and the third internal clock ICLKFA may simultaneously toggle. As a result of the operation as described above, the first internal clock ICLKRA, the second internal clock ICLKRB, the third internal clock ICLKFA, and the fourth internal clock ICLKFB, which are generated in the multi-phase clock generation circuit according to an embodiment of the present invention, may be generated to have a phase difference of 90° therebetween. Specifically, the third internal clock ICLKFA may be set to have a phase delayed by 90°, the second internal clock ICLKRB may be set to have a phase delayed by 180°, and the fourth internal clock ICLKFB may be set to have a phase delayed by 270° relative to the first internal clock ICLKRA.

The multi-phase clock generation circuit according to an embodiment of the present invention may simultaneously toggle the levels of the fourth internal clock ICLKFB and the third internal clock ICLKFA through the first buffer section 11 and the second buffer section 12 illustrated in FIG. 2 in synchronization with the falling edge of the external clock CLK, while simultaneously toggling the levels of the first internal clock ICLKRA and the second internal clock ICLKRB through the third buffer section 21 and the fourth buffer section 22 illustrated in FIG. 3 in synchronization with the rising edge of the external clock CLK. Consequently, as compared with delaying and generating internal clocks through a plurality of D flip-flops and inverters in conventional multi-phase internal clocks, it is possible to remove internal time delay and sufficiently ensure a margin for the high speed operation of the semiconductor memory device.

Figure 5:
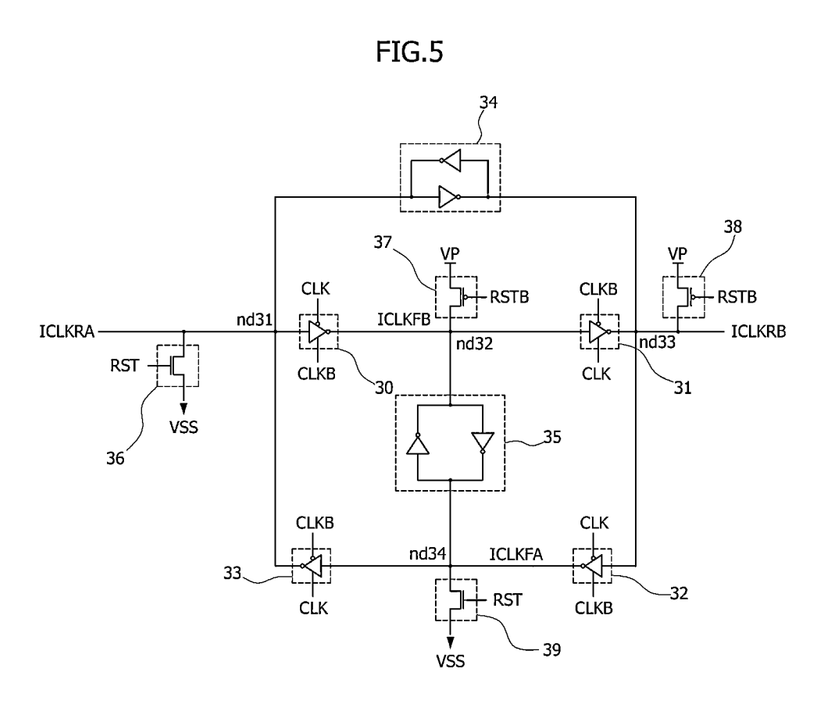
FIG. 5 is a circuit diagram illustrating the configuration of a multi-phase clock generation circuit according to another embodiment of the present invention.

As illustrated in FIG. 5, the multi-phase clock generation circuit according to an embodiment of the present invention may include a first buffer 30, a second buffer 31, a third buffer 32, a fourth buffer 33, a first latch 34, a second latch 35, a first initialization element 36, a second initialization element 37, a third initialization element 38, and a fourth initialization element 39.

The first buffer 30 may be configured to invert and buffer the first internal clock ICLKRA in synchronization with the falling edge (corresponds to the rising edge of the inverted external clock CLKB) of the external clock CLK, and to generate the fourth internal clock ICLKFB.

The second buffer 31 may be configured to invert and buffer the fourth internal clock ICLKFB in synchronization with the rising edge (corresponds to the falling edge of the inverted external clock CLKB) of the external clock CLK, and to generate the second internal clock ICLKRB.

The third buffer 32 may be configured to invert and buffer the second internal clock ICLKRB in synchronization with the falling edge (corresponds to the rising edge of the inverted external clock CLKB) of the external clock CLK, and to generate the third internal clock ICLKFA.

The fourth buffer 33 may be configured to invert and buffer the third internal clock ICLKFA in synchronization with the rising edge (corresponds to the falling edge of the inverted external clock CLKB) of the external clock CLK, and to generate the first internal clock ICLKRA.

The first latch 34 may be configured to be connected between a node nd31 and a node nd33 and to latch voltages of the node nd31 and the node nd33. At the node nd31, the first internal clock ICLKRA may be outputted and at the node nd33, the second internal clock ICLKRB may be outputted.

The second latch 35 may be configured to be connected between a node nd32 and a node nd34 and to latch voltages of the node nd32 and the node nd34. At the node nd32, the fourth internal clock ICLKFB may be outputted and at the node nd34, the third internal clock ICLKFA may be outputted.

The first initialization element 36 may be configured to initialize the first internal clock ICLKRA to a logic low level via a ground voltage VSS in response to the reset signal RST. The second initialization element 37 may be configured to initialize the fourth internal clock ICLKFB to a logic high level via a driving voltage VP in response to the inverted reset signal RSTB. The third initialization element 38 may be configured to initialize the second internal clock ICLKRB to a logic high level via the driving voltage VP in response to the inverted reset signal RSTB. The fourth initialization element 39 may be configured to initialize the third internal clock ICLKFA to a logic low level via the ground voltage VSS in response to the reset signal RST.

The multi-phase clock generation circuit configured above according to various embodiments of the present invention may simultaneously toggle the levels of the fourth internal clock ICLKFB and the third internal clock ICLKFA through the first buffer 30 and the third buffer 32 in synchronization with the falling edge of the external clock CLK, while simultaneously toggling the levels of the first internal clock ICLKRA and the second internal clock ICLKRB through the second buffer 31 and the fourth buffer 33 in synchronization with the rising edge of the external clock CLK. Consequently, as compared with delaying and generating internal clocks through a plurality of D flip-flops and inverters in conventional multi-phase internal clocks, it is possible to remove internal time delay and sufficiently ensure a margin for the high speed operation of the semiconductor memory device.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A multi-phase clock generation circuit comprising:
a first clock buffer unit configured to invert and buffer a first internal clock and a second internal clock in response to an external clock, and to generate a third internal clock and a fourth internal clock; and
a second clock buffer unit configured to invert and buffer the third internal clock and the fourth internal clock in response to the external clock, and to generate the first internal clock and the second internal clock,
wherein the first clock buffer unit comprises a first buffer section configured to invert and buffer the first internal clock in synchronization with a first edge of the external clock, and to output the fourth internal clock to a first node, and a second buffer section configured to invert and buffer the second internal clock in synchronization with the first edge of the external clock, and to output the third internal clock to a second node.

2. The multi-phase clock generation circuit of claim 1, wherein the first clock buffer unit is configured to invert and buffer the first internal clock in synchronization with a first edge of the external clock, and to generate the fourth internal clock.

3. The multi-phase clock generation circuit of claim 2, wherein the first clock buffer unit is configured to invert and buffer the second internal clock in synchronization with the first edge of the external clock, and to generate the third internal clock.

4. The multi-phase clock generation circuit of claim 3, wherein the second clock buffer unit is configured to invert and buffer the third internal clock in synchronization with a second edge of the external clock, and to generate the first internal clock.

5. The multi-phase clock generation circuit of claim 4, wherein the second clock buffer unit is configured to invert and buffer the fourth internal clock in synchronization with the second edge of the external clock, and to generate the second internal clock.

6. The multi-phase clock generation circuit of claim 5, wherein the first edge is a falling edge of the external clock and the second edge is a rising edge of the external clock.

7. The multi-phase clock generation circuit of claim 1, further comprising:
a latch section configured to be connected between the first node and the second node and to latch voltages of the first node and the second node.

8. The multi-phase clock generation circuit of claim 7, further comprising:
a first initialization element configured to initialize the voltage of the first node in an initialization operation of a semiconductor memory device; and
a second initialization element configured to initialize the voltage of the second node in the initialization operation of the semiconductor memory device.

9. The multi-phase clock generation circuit of claim 8, wherein the first initialization element is configured to initialize the first node to a driving voltage in response to an inverted reset signal, and the second initialization element is configured to initialize the second node to a ground voltage in response to a reset signal.

10. The multi-phase clock generation circuit of claim 9, wherein the driving voltage is an internal voltage generated in the semiconductor memory device, or an external voltage applied from an external source detached from the semiconductor memory device.

11. The multi-phase clock generation circuit of claim 1, wherein the second clock buffer unit comprises:
a third buffer section configured to invert and buffer the third internal clock in synchronization with a second edge of the external clock, and to output the first internal clock to a third node; and
a fourth buffer section configured to invert and buffer the fourth internal clock in synchronization with the second edge of the external clock, and to output the second internal clock to a fourth node.

12. The multi-phase clock generation circuit of claim 11, further comprising:
a latch section configured to be connected between the third node and the fourth node and to latch voltages of the third node and the fourth node.

13. The multi-phase clock generation circuit of claim 12, further comprising:
a first initialization element configured to initialize the voltage of the third node in an initialization operation of a semiconductor memory device; and
a second initialization element configured to initialize the voltage of the fourth node in the initialization operation of the semiconductor memory device.

14. The multi-phase clock generation circuit of claim 13, wherein the first initialization element is configured to initialize the third node to a ground voltage in response to a reset signal, and the second initialization element is configured to initialize the fourth node to a driving voltage in response to an inverted reset signal.

15. The multi-phase clock generation circuit of claim 14, wherein the driving voltage is an internal voltage generated in the semiconductor memory device, or an external voltage applied from an external source detached from the semiconductor memory device.

16. The multi-phase clock generation circuit of claim 1, wherein the third internal clock has a phase delayed by 90° when compared with the first internal clock, the second internal clock has a phase delayed by 180° when compared with the first internal clock, and the fourth internal clock has a phase delayed by 270° when compared with the first internal clock.

17. A multi-phase clock generation circuit comprising:
a first buffer configured to invert and buffer a first internal clock in synchronization with a first edge of an external clock, and to generate a fourth internal clock;
a second buffer configured to invert and buffer the fourth internal clock in synchronization with a second edge of the external clock, and to generate a second internal clock;
a third buffer configured to invert and buffer the second internal clock in synchronization with the first edge of the external clock, and to generate a third internal clock;
a fourth buffer configured to invert and buffer the third internal clock in synchronization with the second edge of the external clock, and to generate the first internal clock; and
a first latch configured to be connected between a first node, through which the first internal clock is outputted, and a second node, through which the second internal clock is outputted, and to latch voltages of the first node and the second node.

18. The multi-phase clock generation circuit of claim 17, wherein the third internal clock has a phase delayed by 90° when compared with the first internal clock, the second internal clock has a phase delayed by 180° when compared with the first internal clock, and the fourth internal clock has a phase delayed by 270° when compared with the first internal clock.

19. The multi-phase clock generation circuit of claim 17, wherein the first edge is a falling edge of the external clock and the second edge is a rising edge of the external clock.

20. The multi-phase clock generation circuit of claim 17, further comprising:
   a second latch configured to be connected between a third node, through which the fourth internal clock is outputted, and a fourth node, through which the third internal clock is outputted, and to latch voltages of the third node and the fourth node.

21. The multi-phase clock generation circuit of claim 20, further comprising:
   a first initialization element configured to initialize the voltage of the first node in an initialization operation of a semiconductor memory device.

22. The multi-phase clock generation circuit of claim 21, further comprising:
   a second initialization element configured to initialize the voltage of the second node in the initialization operation of the semiconductor memory device.

23. The multi-phase clock generation circuit of claim 22, further comprising:
   a third initialization element configured to initialize the voltage of the third node in the initialization operation of the semiconductor memory device.

24. The multi-phase clock generation circuit of claim 23, further comprising:
   a fourth initialization element configured to initialize the voltage of the fourth node in the initialization operation of the semiconductor memory device.

25. The multi-phase clock generation circuit of claim 24, wherein the first and fourth initialization elements are configured to initialize the first and fourth nodes to a ground voltage in response to a reset signal, and the second and third initialization elements are configured to initialize the second and third nodes to a driving voltage in response to an inverted reset signal.

* * * * *